US011217363B2

(12) United States Patent
Omae

(10) Patent No.: US 11,217,363 B2
(45) Date of Patent: Jan. 4, 2022

(54) WIRE HARNESS WITH END PORTION OF FLEXIBLE SHIELDING MEMBER CONNECTED TO OUTER CIRCUMFERENTIAL SURFACE TO TUBE-SHAPED MEMBER

(71) Applicant: SUMITOMO WIRING SYSTEMS, LTD., Yokkaichi (JP)

(72) Inventor: Hikaru Omae, Yokkaichi (JP)

(*) Notice: Subject to any disclaimer, the term of this patent is extended or adjusted under 35 U.S.C. 154(b) by 0 days.

(21) Appl. No.: 17/040,261

(22) PCT Filed: Mar. 25, 2019

(86) PCT No.: PCT/JP2019/012416
§ 371 (c)(1),
(2) Date: Sep. 22, 2020

(87) PCT Pub. No.: WO2019/188939
PCT Pub. Date: Oct. 3, 2019

(65) Prior Publication Data
US 2021/0012925 A1    Jan. 14, 2021

(30) Foreign Application Priority Data
Mar. 30, 2018    (JP) .............................. JP2018-069920

(51) Int. Cl.
*H01B 7/00*    (2006.01)
*H02G 3/04*    (2006.01)
*H05K 9/00*    (2006.01)

(52) U.S. Cl.
CPC ......... *H01B 7/0045* (2013.01); *H02G 3/0462* (2013.01); *H05K 9/0043* (2013.01); *H05K 9/0098* (2013.01)

(58) Field of Classification Search
CPC ........ H01B 7/00; H01B 7/0045; H01B 7/188; H01B 7/228; H01B 11/1033; H02G 3/04;
(Continued)

(56) References Cited

U.S. PATENT DOCUMENTS 3,280,246 A * 10/1966 Lawson ........... H01R 13/65918
174/88 C
3,465,092 A *  9/1969 Schwartz ............... H01R 4/646
174/78
(Continued)

FOREIGN PATENT DOCUMENTS

JP    S59-018385 U    2/1984
JP    2004-171952 A   6/2004
(Continued)

OTHER PUBLICATIONS

Jun. 11, 2019 International Search Report issued in International Patent Application No. PCT/JP2019/012416.

*Primary Examiner* — Timothy J Thompson
*Assistant Examiner* — Michael F McAllister
(74) *Attorney, Agent, or Firm* — Oliff PLC

(57) ABSTRACT

A wire harness, including: a plurality of wire groups, each including a plurality of wires; a tube made of metal into which the wire groups are inserted; and a plurality of flexible shields with a tube shape that each enclose one of the wire groups, wherein connectors provided at ends of the flexible shields are each connected to a portion of an outer circumferential surface of the tube in a circumferential direction of the tube.

5 Claims, 2 Drawing Sheets

(58) Field of Classification Search
CPC ...... H02G 3/0462; H05K 9/00; H05K 9/0098; H05K 9/0043; H01R 13/6596
USPC ...................................................... 174/72 A
See application file for complete search history.

(56) References Cited

U.S. PATENT DOCUMENTS

| | | | | |
|---|---|---|---|---|
| 4,086,427 | A * | 4/1978 | Nasuta, Jr. | ............... H01R 9/05 |
| | | | | 174/78 |
| 4,558,918 | A * | 12/1985 | Shores | ............ H01R 13/65914 |
| | | | | 439/579 |
| 4,579,415 | A * | 4/1986 | Van Brunt | ............. H01R 9/038 |
| | | | | 439/607.5 |
| 5,266,744 | A * | 11/1993 | Fitzmaurice | ........... H01B 11/20 |
| | | | | 174/103 |
| 6,143,986 | A * | 11/2000 | Anderson | ............. H01R 9/038 |
| | | | | 174/72 A |
| 6,395,977 | B1 * | 5/2002 | Yamamoto | ............ H01R 24/44 |
| | | | | 174/36 |
| 7,094,970 | B2 | 8/2006 | Kihira | |
| 9,017,110 | B2 * | 4/2015 | Guillanton | ........... H02G 3/0462 |
| | | | | 439/730 |
| 2010/0178805 | A1 * | 7/2010 | Yong | ................... H01R 13/648 |
| | | | | 439/607.41 |

FOREIGN PATENT DOCUMENTS

| | | |
|---|---|---|
| JP | 2006-310474 A | 11/2006 |
| JP | 2008-41479 A | 2/2008 |
| WO | 2018/056460 A1 | 3/2018 |

\* cited by examiner

WIRE HARNESS WITH END PORTION OF FLEXIBLE SHIELDING MEMBER CONNECTED TO OUTER CIRCUMFERENTIAL SURFACE TO TUBE-SHAPED MEMBER

BACKGROUND

The present disclosure relates to a wire harness for use in a vehicle or the like.

A known wire harness for a vehicle includes a shield structure in which a tube-shaped flexible shielding member encloses a plurality of wires collectively and an end portion of the flexible shielding member is connected to a metal tube-shaped member (shield shell or the like) (for example, see JP 2004-171952A).

Such a wire harness preferably includes a shield structure in which, in a case where the wires extending out from the tube-shaped member branch into a plurality of wires (wire groups), the branched wire groups are each enclosed by a flexible shielding member collectively. For example, in a wire harness according to JP 2006-310474A, an end portion of a tube-shape first flexible shielding member that encloses a first wire group is externally fitted on and connected to a metal tube-shaped member, and wire groups other than the first wire group and a second flexible shielding member that encloses these other wire groups extend out through an outlet hole formed in the first flexible shielding member.

SUMMARY

The wire harness according to JP 2006-310474A is difficult to assemble in terms of connecting the flexible shielding members that enclose the wire groups to the tube-shaped member. In other words, the ease of assembly is inhibited by the need to insert the second flexible shielding member (and the wire group) into the outlet hole of the first flexible shielding member and connect together an end portion of the second flexible shielding member and the tube-shaped member inside the first flexible shielding member.

An exemplary aspect of the disclosure provides a wire harness capable of reducing the difficulty in assembling a plurality of flexible shielding members.

A wire harness according to an exemplary aspect includes a plurality of wire groups, each including a plurality of wires; a tube made of metal into which the wire groups are inserted; and a plurality of flexible shields with a tube shape that each enclose one of the wire groups, wherein connectors provided at ends of the flexible shields are each connected to a portion of an outer circumferential surface of the tube in a circumferential direction of the tube.

A wire harness according to the present disclosure is capable of reducing the difficulty in assembling a plurality of flexible shields.

DETAILED DESCRIPTION OF EMBODIMENTS

Figure 1:
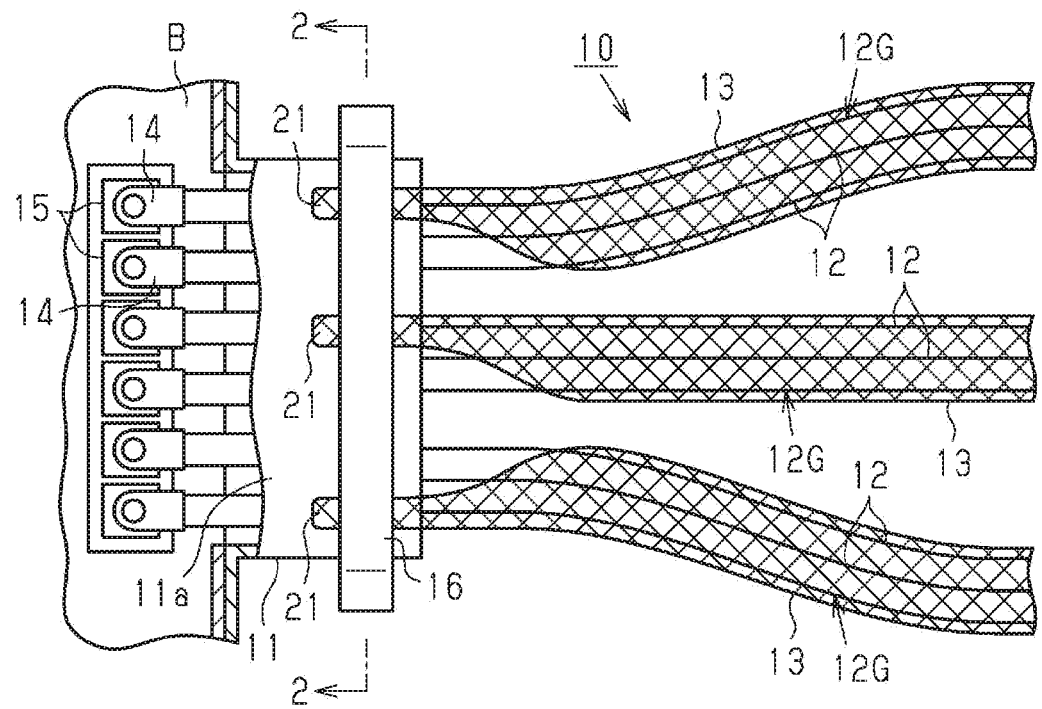
FIG. 1 is a plan view of a wire harness according to an embodiment.

An embodiment of a wire harness will be described below. Note that in the drawings, components of the configuration may be exaggerated or simplified for the sake of convenience. Also, the dimensions and proportions of the components may differ from actual values.

As shown in FIG. 1, a wire harness 10 of the present embodiment includes a tube-shaped member 11 (tube) made of metal, six wires 12 inserted into the tube-shaped member 11, and three tube-shaped flexible shielding members 13 (shields).

The wires 12 are made of an unshielded type of coated wire which does not include a shield structure. Two wires of the wires 12 form one wire group 12G. In other words, in the present embodiment, three wire groups 12G, each including two wires 12, are formed.

The tube-shaped member 11 of the present embodiment, for example, is a shield shell attached to a battery B of a vehicle and is provided at an end portion of the wire harness 10 in the length direction. The tube-shaped member 11 is configured to shield the wires 12 at the connection portion with the battery B.

The wires 12 are inserted in the tube-shaped member 11 and extend toward the battery B. Inside the battery B, terminals 14 provided on first end portions of the wires 12 are connected to terminals 15 on the battery B side. The wires 12 extending out from the tube-shaped member 11 branch into the three wire groups 12G. The wire groups 12G can be connected to different devices (not shown).

The flexible shielding members 13 are formed in a tube shape from a metal material. The flexible shielding members 13 each collectively enclose one of the wire groups 12G extending out from the tube-shaped member 11 and are configured to provide shielding from electromagnetic noise from the wires 12. Also, the flexible shielding members 13 have a highly flexible configuration to facilitate routing of the wire groups 12G. The flexible shielding members 13 of the present embodiment, for example, are tube-shaped braided members including a plurality of metal wire strands braided together into a mesh.

At a first end portion of each of the flexible shielding members 13 in the length direction, a connection portion 21 (connector) for connection to an outer circumferential surface 11a of the tube-shaped member 11 is formed as an extension. The connection portion 21 is formed by bundling together the metal wire strands of the flexible shielding member 13 at a portion in the circumferential direction of the flexible shielding member 13. Also, in the region in the circumferential direction of the flexible shielding member 13 where the connection portion 21 is not present, the wires 12 are exposed from the flexible shielding member 13.

Figure 2:
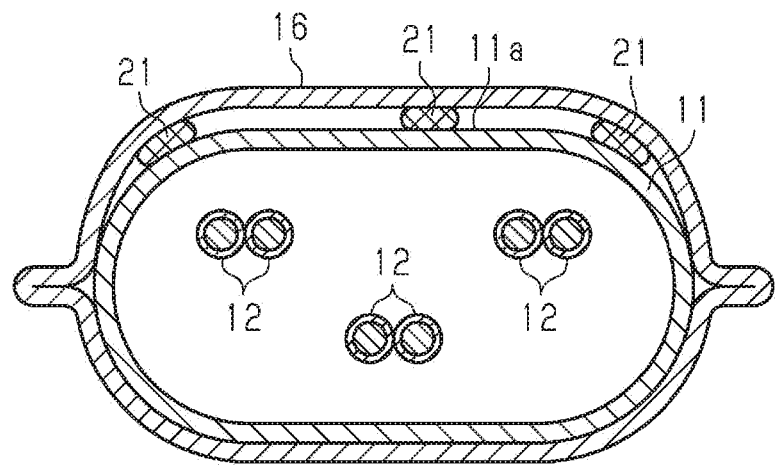
FIG. 2 is an end view taking along a line 2-2 in FIG. 1.

As shown in FIG. 2, the connection portions 21 of the flexible shielding members 13 are connected to the outer circumferential surface 11a of the tube-shaped member 11 by a crimp ring 16. The crimp ring 16 fits onto the tube-shaped member 11, sandwiching the connection portions 21 between the crimp ring 16 and the outer circumferential surface 11a of the tube-shaped member 11. Also, by crimping using the crimp ring 16, the connection portions 21 are pressed against the outer circumferential surface 11a of the tube-shaped member 11.

When connected to the tube-shaped member 11, the connection portions 21 are spaced apart from one another in the circumferential direction of the tube-shaped member 11. The width of each of the connection portions 21 in the circumferential direction of the tube-shaped member 11 is less than the outer circumference length (length of circumference) of the portion of the tube-shaped member 11 (a first end portion of the tube-shaped member 11) to which the connection portions 21 are connected, and the connection portions 21 are each connected to a portion of the outer circumferential surface 11a of the tube-shaped member 11 in the circumferential direction. Also, in the present embodiment, the connection portions 21 are connected within a range of one half of the tube-shaped member 11 in the circumferential direction (within a range of an upper half shown in FIG. 2). In other words, the positions where the connection portions 21 are connected to the tube-shaped member 11 are located eccentric to one side in the circumferential direction of the tube-shaped member 11.

Next, actions of the present embodiment will be described.

The wires 12 extending out from the tube-shaped member 11 connected to the battery B branch into the wire groups 12G, with the wire groups 12G connecting to different devices. The branched wire groups 12G are each shielded by one of the flexible shielding members 13 connected to the tube-shaped member 11 via the connection portion 21. Thus, shielding from electromagnetic noise from the wire groups 12G is provided.

Next, effects of the present embodiment will be described.

(1) The connection portions 21 provided at the end portions (ends) of the flexible shielding members 13 that enclose the wire groups 12G are connected to the outer circumferential surface 11a of the tube-shaped member 11 at respective portions in the circumferential direction. According to this configuration, the flexible shielding members 13 can be connected to the tube-shaped member 11 without employing a configuration in which a flexible shielding member is inserted into an outlet hole formed in another flexible shielding member. Thus, each of the branched wire groups 12G can be shielded by a different flexible shielding member 13 without the ease of assembly being inhibited.

(2) The wire harness 10 includes the crimp ring 16, i.e., a coupling member/coupler, that couples the connection portions 21 to the outer circumferential surface 11a of the tube-shaped member 11. According to this configuration, the connection portions 21 can be easily connected to the tube-shaped member 11 via the coupling member. Also, crimping via the crimp ring 16 allows the connection portions 21 to be firmly fixed to the outer circumferential surface 11a of the tube-shaped member 11.

(3) The connection portions 21 are connected within a range of one half of the tube-shaped member 11 in the circumferential direction. This makes attaching the connection portions 21 to the tube-shaped member 11 easy.

The following modifications can be made to the present embodiment. The present embodiment and the following modified examples can be implemented in any combination within a technically consistent range.

Figure 3:
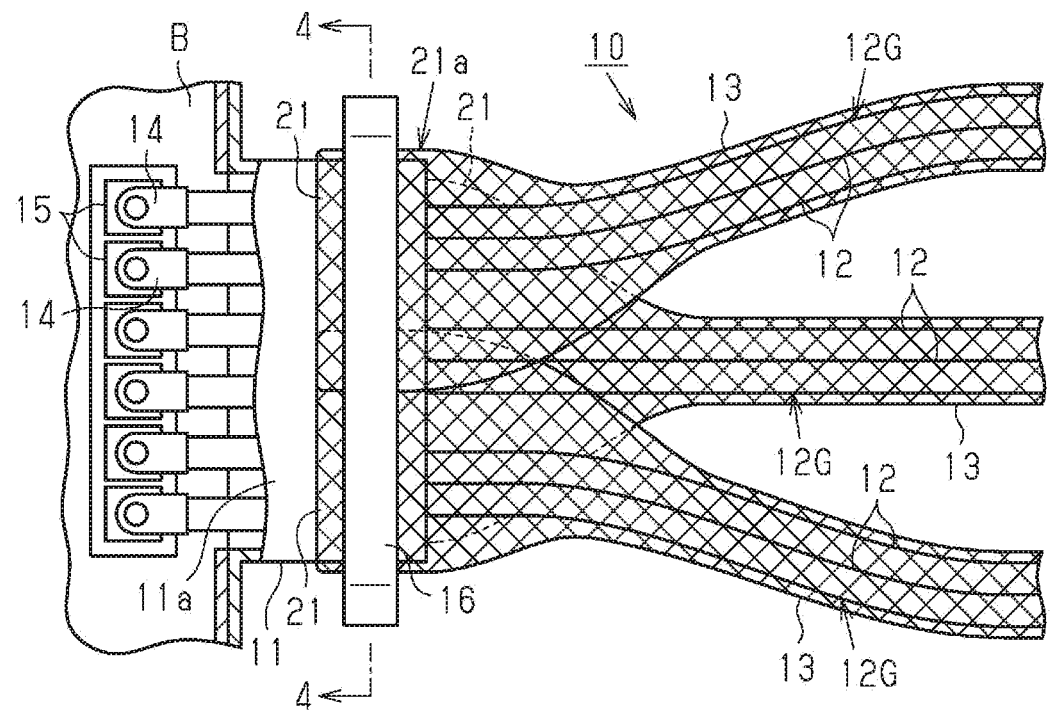
FIG. 3 is a plan view of a wire harness according to a modified example.
Figure 4:
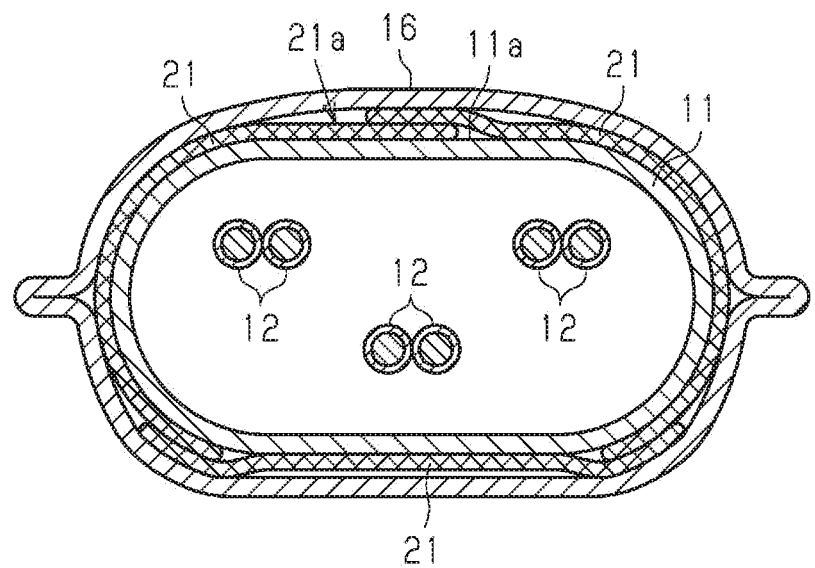
FIG. 4 is an end view taking along a line 4-4 in FIG. 3.

In the above-described embodiment, the metal wire strands that form the flexible shielding members 13 are bundled together to form the connection portions 21. However, no such limitation is intended, and, as shown in FIGS. 3 and 4 for example, the connection portions 21 may have a wide sheet-shaped configuration. In the configuration in these drawings, an annular cover portion 21a that encloses the outer circumferential surface 11a of the tube-shaped member 11 entirely in the circumferential direction is formed from a plurality of sheet-shaped connection portions 21. Specifically, end portions of the connection portions 21 adjacent in the circumferential direction of the tube-shaped member 11 overlap one another in a direction orthogonal to the axis direction of the tube-shaped member 11 (radial direction). In this way, the annular cover portion 21a including the plurality of connection portions 21 can have a configuration which encloses the outer circumferential surface 11a of the tube-shaped member 11 completely without gaps in the circumferential direction. Also, the annular cover portion 21a extends a predetermined length on the side where the wires 12 extend (the side opposite to the battery B), maintaining an annular shape that corresponds to the shape of the outer circumferential surface 11a of the tube-shaped member 11.

According to this configuration, at the transition section between the main portions (tube-shape portions) and the connection portions 21 of the flexible shielding members 13, the exposed portions of the wires 12 exposed from the flexible shielding members 13 can be kept to a minimum via the annular cover portion 21a. This contributes to enhancing shield performance. Also, the end portions of the connection portions 21 adjacent in the circumferential direction of the tube-shaped member 11 overlap one another. This configuration allows the gaps between adjacent connection portions 21 to be further reduced, thus further reducing the exposed portions of the wires 12.

In the above-described embodiment, the crimp ring 16 is used as a coupling member that couples the connection portions 21 to the outer circumferential surface 11a of the tube-shaped member 11. However, no such limitation is intended. For example, a metal band or adhesive tape may be used instead of the crimp ring 16. Also, the connection portions 21 may be fixed to the outer circumferential surface 11a of the tube-shaped member 11 via welding or adhesion without using a coupling member such as the crimp ring 16.

In the above-described embodiment, the connection portions 21 are connected within a range of one half of the tube-shaped member 11 in the circumferential direction. However, the connection portions 21 may also be connected to the tube-shaped member 11 at positions spaced evenly apart from one another in the circumferential direction.

In the above-described embodiment, the number of the wire groups 12G and the number of the flexible shielding members 13 enclosing the wire groups 12G are examples. Depending on the specifications of the vehicle, these numbers may be changed to two or four or more as appropriate.

In the above-described embodiment, the number of the wires 12 in each of the wire groups 12G is an example. Depending on the specifications of the vehicle, this number may be changed to three or more as appropriate.

In the above-described embodiment, a braided member is used as the flexible shielding member 13. However, no such limitation is intended. The flexible shielding member 13 is only required to be a shielding member with flexibility and, for example, may be a metal foil instead of a braided member.

The above-described embodiment is an example in which the wires 12 extending from the tube-shaped member 11, i.e., a shield shell, provided at an end portion of the wire harness 10 in the length direction and attached to the battery B branch into the wire groups 12G. However, no such limitation is intended, and, for example, a configuration may be employed in which the wires 12 are inserted into a metal shielding pipe (tube-shaped member) provided at an intermediate portion of the wire harness 10 in the length direction, and the wires 12 extending from an opening end of the shielding pipe branch into the wire groups 12G.

It should be apparent to those skilled in the art that the present disclosure may be embodied in many other specific forms without departing from the technical spirit or scope of the disclosure. For example, some of the components described in the embodiment (or one or more variations thereof) may be omitted, or some of the components may be combined.

The invention claimed is:

1. A wire harness, comprising:
   a plurality of wire groups, each including a plurality of wires;
   a tube made of metal into which the wire groups are inserted; and
   a plurality of flexible shields with a tube shape that each enclose one of the wire groups,
   wherein connectors provided at ends of the flexible shields are each connected to a portion of an outer circumferential surface of the tube in a circumferential direction of the tube, such that the connectors directly contact the portion of the outer circumferential surface of the tube.

2. The wire harness according to claim 1, further comprising
   a coupler that couples the connectors to the outer circumferential surface of the tube.

3. The wire harness according to claim 2,
   wherein the coupler is a crimp ring attached to the outer circumferential surface of the tube sandwiching the connectors between the crimp ring and the outer circumferential surface of the tube.

4. The wire harness according to claim 1,
   wherein the connectors form an annular cover that encloses the outer circumferential surface of the tube entirely in the circumferential direction.

5. The wire harness according to claim 4,
   wherein ends of the connectors adjacent in the circumferential direction of the tube overlap one another.

* * * * *